US008687332B2

(12) United States Patent
Yu

(10) Patent No.: US 8,687,332 B2
(45) Date of Patent: Apr. 1, 2014

(54) TRANSISTOR CIRCUIT WITH PROTECTING FUNCTION

(75) Inventor: Chung-Che Yu, New Taipei (TW)

(73) Assignee: Green Solution Technology Co., Ltd., New Taipei (TW)

( * ) Notice: Subject to any disclaimer, the term of this patent is extended or adjusted under 35 U.S.C. 154(b) by 90 days.

(21) Appl. No.: 13/350,423

(22) Filed: Jan. 13, 2012

(65) Prior Publication Data
US 2012/0236456 A1 Sep. 20, 2012

(30) Foreign Application Priority Data

Mar. 17, 2011 (TW) .............................. 100109226 A

(51) Int. Cl.
H02H 7/00 (2006.01)
(52) U.S. Cl.
USPC ............................................................ 361/79
(58) Field of Classification Search
USPC .............................................. 361/79, 91, 101
See application file for complete search history.

(56) References Cited

U.S. PATENT DOCUMENTS

| 4,694,372 | A  | * | 9/1987 | Sibeud ........................... 361/86 |
| 5,635,823 | A  | * | 6/1997 | Murakami et al. ............ 323/277 |
| 6,515,436 | B2 | * | 2/2003 | Kobayashi et al. ........... 315/307 |
| 6,624,994 | B1 | * | 9/2003 | Schmoock et al. .......... 361/93.1 |
| 6,713,979 | B2 | * | 3/2004 | Naito et al. .................... 318/280 |
| 2005/0099751 | A1 | * | 5/2005 | Kumagai ..................... 361/100 |

FOREIGN PATENT DOCUMENTS

JP              401068005 A    *   3/1989     ............... H03F 1/52

* cited by examiner

Primary Examiner — Stephen W Jackson
(74) Attorney, Agent, or Firm — Muncy, Geissler, Olds & Lowe, P.C.

(57) ABSTRACT

The present invention provides a transistor circuit with protecting function. The transistor circuit includes a transistor, a voltage detecting unit, a current detecting unit, a temperature detecting unit, and a protecting unit. The voltage detecting unit detects a voltage drop of the transistor and generates an over-voltage protection signal. The current detecting signal detects a current flowing through the transistor and generates an over-current protection signal. The temperature detecting unit detects a temperature of the transistor circuit and generates an over-temperature protection signal. The protecting unit is coupled to the control terminal to control a state of the transistor according to the over-voltage protection signal, the over-current protection signal, and the over-temperature protection signal to reduce the voltage difference between the control terminal and the second terminal, such that the voltage drop of the transistor is decreased or decreased to zero.

16 Claims, 6 Drawing Sheets

TRANSISTOR CIRCUIT WITH PROTECTING FUNCTION

BACKGROUND

1. Field of the Invention

The present invention relates to a transistor circuit with protecting function, and more particularly a transistor circuit with protecting function packaged in a single package.

2. Description of Related Art

A conventional MOSFET has a safe operating area (SOA) and the safe operating area is determined by a largest current, a largest power, a largest voltage and a largest temperature that the MOSFET is able to handle without damage. The reliability of the MOSFET may be decreased, even damaged, when the MOSFET is operated out of safe operating area. In conventional arts, a protecting circuit is connected to the MOSFET externally. The protecting circuit detects a state of the MOSFET (such as a current flowing through the MOSFET), judges whether the MOSFET operates in the safe operating area and protects the MOSFET from being damaged.

However, not all MOSFET controllers detect the state of the MOSFET to protect it. The controller without MOSFET protecting function cannot make sure that the MOSFET operates in the safe operating area. In addition, if the MOSFET and the controller with MOSFET protecting function are packaged in different packages, the problem of noise interference and signal transmission delay may occur. Moreover, the protecting circuit for detecting the temperature of the MOSFET may have an error due to different packages.

SUMMARY

The present invention provides a transistor circuit which has a MOSFET and a protecting circuit packaged in the same package to make sure that electric characteristics of semiconductor element(s) in the circuit to be equivalent. Therefore, the protecting circuit can protect the transistor from damaged immediately and accurately. Furthermore, the transistor circuit of the present invention has advantages of lower cost and higher yield rate due to the circuit manufactured in the same package.

To accomplish the aforementioned and other objects, an exemplary embodiment of the invention provides a transistor circuit with protecting function, packaged in a single package having a first terminal, a second terminal and a control terminal. The transistor circuit comprises a transistor, a voltage detecting unit and a protecting unit. The transistor has a drain end, a source end and a gate end. The drain end is coupled to the first terminal, the source end is coupled to the second terminal and the gate end is coupled to the control terminal. The voltage detecting unit detects a voltage drop of the transistor and generates an over-voltage protection signal. The protecting unit is coupled to the control terminal to control a state of the transistor according to the over-voltage protection signal. Wherein, the protecting unit reduces the voltage difference between the control and the second terminal when the voltage drop of the transistor is higher than a preset voltage, such that a current flowing through the transistor is decreased or decreased to zero.

To accomplish the aforementioned and other objects, an exemplary embodiment of the invention further provides a transistor circuit with protecting function, packaged in a single package having a first terminal, a second terminal and a control terminal. The transistor circuit comprises a transistor, a current detecting unit and a protecting unit. The transistor has a drain end, a source end and a gate end. The drain end is coupled to the first terminal, the source end is coupled to the second terminal and the gate end is coupled to the control terminal. The current detecting unit detects a current flowing through the transistor and generates an over-current protection signal. The protecting unit is coupled to the control terminal to control a state of the transistor according to the over-current protection signal. Wherein, the protecting unit reduces the voltage difference between the control and the second terminal when the current flowing through the transistor is higher than a preset current, such that the current flowing through the transistor is decreased or decreased to zero.

It is to be understood that both the foregoing general description and the following detailed description are exemplary, and are intended to provide further explanation of the invention as claimed. In order to make the features and the advantages of the invention comprehensible, exemplary embodiments accompanied with figures are described in detail below.

BRIEF DESCRIPTION OF THE DRAWINGS

The present invention will now be specified with reference to its preferred embodiment illustrated in the drawings, in which.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
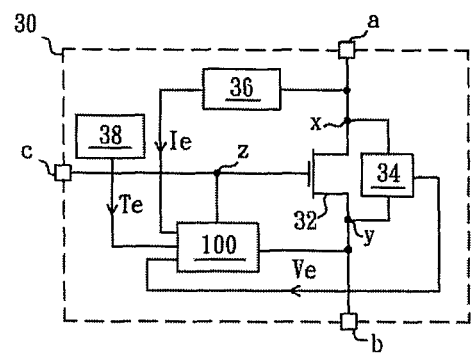
FIG. 1 is a block diagram of a transistor circuit with protecting function according to the present invention.

FIG. 1 is a block diagram of a transistor circuit with protecting function according to the present invention. A transistor circuit 30 is packaged in a single package structure having a first terminal a, a second terminal b, and a control terminal c, wherein the transistor circuit 30 comprises a transistor 32, a voltage detecting unit 34, a current detecting unit 36, a temperature detecting unit 38 and a protecting unit 100. The transistor 32 comprises a drain end x coupled to the first terminal a, a source end y coupled to the second terminal b, and a gate end z coupled to the control terminal c. The voltage detecting unit 34 is coupled between the first terminal a and the second terminal b to detect the voltage drop of the transistor 32 and generates an over-voltage protection signal Ve when the voltage drop of the transistor 32 is over high (that is higher than a preset voltage). The current detecting unit 36 is coupled to the first terminal a to detect the current flowing through the transistor 32 and generates an over-current protection signal Ie when the current flowing through the transistor 32 is too high (that is higher than a preset current). The temperature detecting unit 38 detects the temperature of the transistor circuit 30 and generates an over-temperature protection signal Te when the temperature of the transistor circuit 30 is too high (that is higher than a preset temperature). The protecting unit 100 is coupled between the control terminal c and the second terminal b to receive the over-voltage protection signal Ve, the over-temperature protection signal Te, and the over-current protection signal Ie to control a state Of the transistor 32. The protecting unit 100 reduces the voltage difference between the control terminal c and the second terminal b to reduce the voltage difference of the two terminals to zero for example to reduce the current flowing through the transistor 32 or turn off the transistor 32 when one of the over-voltage protection signal Ve, over-temperature protection signal Te, and over-current protection signal Ie is at high-level due to that the load coupled to the transistor 32 is short-circuited or open-circuited, or the temperature of the transistor 32 is over-high. Therefore, the current of the transistor 32 is decreased or decreased to zero or the transistor circuit 30 triggers an external circuit to protect the transistor circuit 30 from over voltage, such that the transistor circuit 30 avoids the damage of the transistor 32 because of the abnormal operation. On the contrary, the transistor 32 operates in the safe operating area and the transistor circuit 30 keeps the normal operation of the transistor 32.

Figure 2:
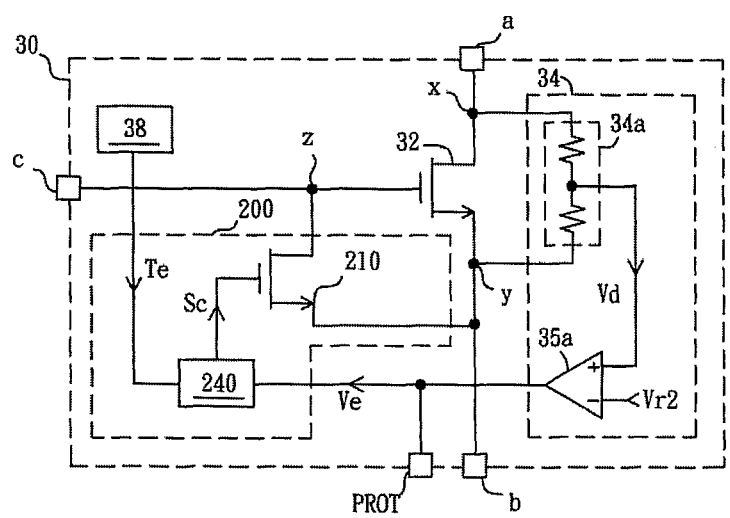
FIG. 2 is a schematic diagram of a transistor circuit with protecting function according to a first embodiment of the present invention.

FIG. 2 is a schematic diagram of a transistor circuit with protecting function according to a first embodiment of the present invention. A transistor circuit 30 is packaged in a single package structure having a first terminal a, a second terminal b, a control terminal c, and a protection terminal PROT, wherein the transistor circuit 30 comprises a transistor 32, a voltage detecting unit 34, a temperature detecting unit 38 and a protecting unit 200. The transistor 32 comprises a drain end x coupled to the first terminal a, a source end y coupled to the second terminal b, and a gate end z coupled to the control terminal c. In the present embodiment, take that a voltage drop between the drain end x and the source end y of the transistor 32 and a temperature of the transistor circuit 30 is too high for example, the circuit operations are described in the following. The voltage detecting unit 34 which detects the voltage drop of the transistor 32 comprises a voltage dividing element 34a and a comparator element 35a. The voltage dividing element 34a is coupled between the drain end x and the source end y to generate a voltage detecting signal Vd to the comparator element 35a. An inverting terminal of the comparator element 35a receives a first reference voltage Vr2 and a non-inverting terminal thereof receives the voltage detecting signal Vd and generates an over-voltage protection signal Ve to the protecting unit 200 when a level of the voltage detecting signal Vd is higher than the first reference voltage Vr2. The main object of the temperature detecting unit 38 is detecting whether the temperature of the transistor circuit 30 is too high or not and the temperature detecting unit 38 generates an over-temperature signal Te to the protecting unit 200 when the temperature of the transistor circuit 30 is too high.

The protecting unit 200 which is coupled between the control terminal c and the second terminal b controls a state of the transistor 32 according to the over-voltage protection signal Ve and the over-temperature protection signal Te. The protecting 200 comprises a switch 210 and a switch controlling unit 240. The switch controlling unit 240 receives the over-voltage protection signal Ve and the over-temperature protection signal Te to generate a switch control signal Sc to control a state of the switch 210. The switch 210 is coupled between the source end y and the gate end z. When the switch 210 receives the switch control signal Sc, the switch 210 is turned on to decrease the voltage difference between the source end y and the gate end z to decrease the current flowing through the transistor 32 to be zero. The foregoing protection may temporarily remove the abnormal conditions of over-temperature and over-voltage, and then the over-voltage protection signal Ve and the over-temperature protection signal Te are stopped. Afterward, the voltage drop of the transistor 32 or the temperature of the transistor circuit 30 may increase again to make the protecting unit 200 re-operating to protect. In the present embodiment, the protecting unit 200 can count the times of the abnormal situation and turn on the switch 210 when the abnormal times reach a preset value, until that the transistor circuit 30 is restarted. The voltage detecting unit 34 can be coupled to the protection terminal PROT, and transmits an external signal to notice a power source supplying unit. The power source supplying unit may stops or decrease an electric power supplying to the transistor circuit 32 when the voltage drop of the transistor 32 is too high, so as to protect the transistor circuit 30 from over voltage.

Figure 3:
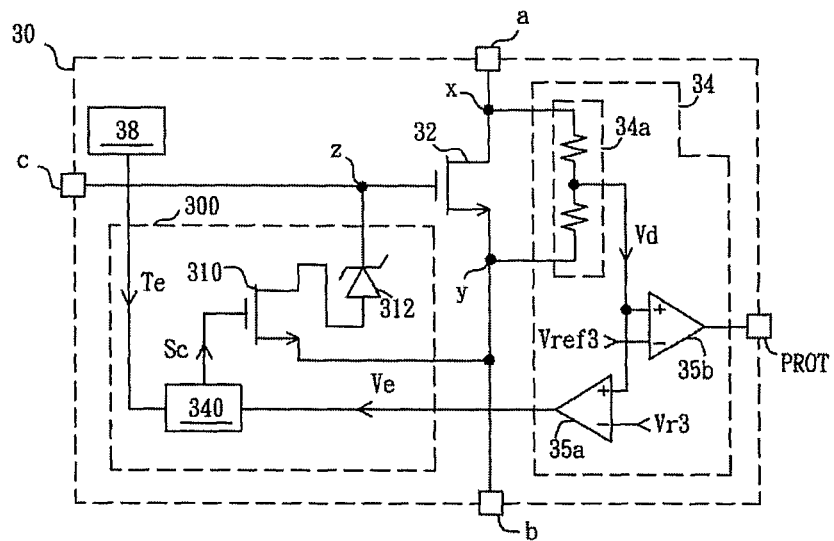
FIG. 3 is a schematic diagram of a transistor circuit with protecting function according to a second embodiment of the present invention.

FIG. 3 is a schematic diagram of a transistor circuit with protecting function according to a second embodiment of the present invention. A transistor circuit 30 is packaged in a single package structure having a first terminal a, a second terminal b, a control terminal c and a protection terminal PROT. The transistor circuit 30 comprises a transistor 32, a voltage, detecting unit 34, a temperature detecting unit 38 and a protecting unit 300. Compared with the first embodiment shown in FIG. 2, the embodiment has the following other functions. In the present embodiment, the current flowing through the transistor 32 is decrease when the voltage drop of the transistor 32 is too high to lower the heat due to the conduction loss of the transistor 32. The protection terminal PROT transmits an external signal to a power source supplying unit to stop the external power source operating when the transistor 32 operates out of SOA thereof. The transistor 32 comprises a drain end x coupled to the first terminal a, a source end y coupled to the second terminal b, and a gate end z coupled to the control terminal c. The voltage detecting unit 34 which detects the voltage drop of the transistor 32 comprises a voltage dividing element 34a, a comparator element 35a and a over-voltage comparator element 35b. The voltage dividing element 34a is coupled between the drain end x and the source end y to generate a voltage detecting signal Vd to the comparator element 35a. An inverting terminal of the comparator element 35a received a first reference voltage Vr3, and a non-inverting terminal thereof receives the voltage detecting signal Vd to generate an over-voltage protection signal Ve to the protecting unit 300 when the level of the voltage detecting signal Vd is higher than that of the first reference voltage Vr3. A non-inverting terminal of the over-voltage comparator element 35b receives the voltage detecting signal Vd, and an inverting terminal receives a second reference voltage Vref3 to generate an over-voltage signal as the external signal via the protection terminal PROT when the level of the voltage detecting signal Vd is higher than that of the second reference voltage Vref3. In the present embodiment, the second reference voltage Vref3 is higher than the first reference voltage Vr3. The main object of the temperature detecting unit 38 is detecting whether the temperature of the transistor circuit 30 is too high or not and the temperature detecting unit 38 generates an over-temperature signal Te to the protecting unit 300 when the temperature of the transistor circuit 30 is higher than a preset temperature.

The protecting unit 300 is coupled between the control terminal c and the second terminal b to control the state of the transistor 32 according to the over-voltage protection signal Ve and the over-temperature protection signal Te. The protecting unit comprises a switch 310, a switch control unit 340 and a voltage clamping element 312. The switch control unit 340 receives the over-voltage protection signal Ve and over-temperature protection signal Te to generate a switch control signal Sc to control a state of the switch 310. The switch 310 has a drain end, a source end and a control end, wherein the drain end is coupled to the gate end z via the voltage clamping element 312, the source end is coupled to the source end y and the control end receives the switch control signal Sc to adjust the voltage difference between the source end y and the gate end z. The switch control unit 340 generates the switch control signal Sc when receiving any one of the over-voltage protection signal Ve and over-temperature protection signal Te to turn on the switch 310. When the switch 310 is turned on, the voltage clamping element 312 clamps the voltage difference between the source end y and the gate end z at a clamped voltage and so the current flowing through the transistor 32 is lower, but not decreased to zero. At this time, the conduction loss of the transistor 32 is decreased to make sure that the transistor 32 operates in the safe operating area. If the voltage drop between the drain end x and the source end y keeps increasing to be higher than a preset voltage after the current flowing there-through is lowered, the over-voltage comparator element 35b generates a protection signal as the external signal via the external signal to the power source supplying unit. The external power source stops or lowers the voltage applied to the transistor circuit 32 and so the voltage drop is decreased to avoid that the transistor 32 operates out of the safe operating area after the transistor circuit 30 reduces the current flowing through the transistor 32.

Figure 4:
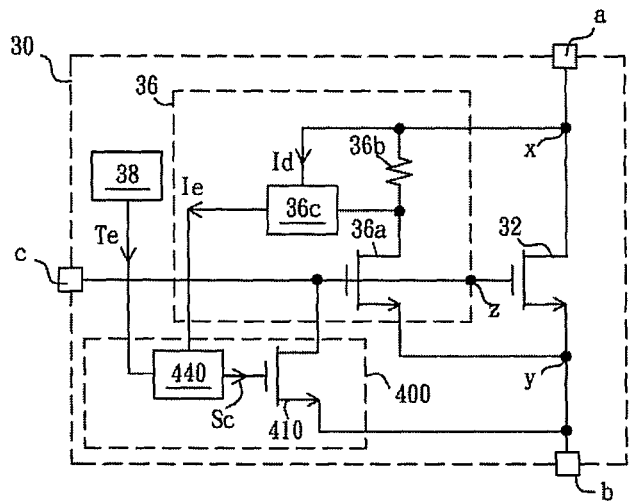
FIG. 4 is a schematic diagram of a transistor circuit with protecting function according to a third embodiment of the present invention.

FIG. 4 is a schematic diagram of a transistor circuit with protecting function according to a third embodiment of the present invention. A transistor circuit 30 is packaged in a single package structure having a first terminal a, a second terminal b and a control terminal c. The transistor 30 comprises a transistor 32, a current detecting unit 36, a temperature detecting unit 38 and a protecting unit 400. The transistor 32 comprises a drain end x coupled to the first terminal a, a source end y coupled to the second terminal b and a gate end z coupled to the control terminal c. The current detecting unit 36 is coupled to the first terminal a to detect the current flowing through the transistor 32. The current detecting unit 36 comprises a detecting transistor 36a, a current detecting resistance 36b and a current sensing element 36c. A drain end of the detecting transistor 36a is coupled to the drain end x of the transistor 32 through the current detecting resistance 36b, a source end thereof is coupled to source end y of the transistor 32, and a gate end thereof is coupled to the gate end z of the transistor 32 to make the current flowing through the detecting transistor 36a in a preset ratio of the current flowing through the transistor 32. Therefore, the current detecting resistance 36b can generate a current detecting signal Id indicative of an amount of the current following through the transistor 32 to the current sensing element 36c. The current sensing element 36c receives the current detecting signal Id to generate an over-current protection signal Ie to the protecting unit 400. The main object of the temperature detecting unit 38 is detecting whether the temperature of the transistor circuit 30 is too high or not and generating an over-temperature signal Te to the protecting unit 400 when the temperature of the transistor circuit 30 is higher than a preset temperature.

The protecting unit 400 is coupled between the control terminal c and the second terminal b and controls the state of the transistor 32 according the over-current protection signal Ie and the over-temperature protection signal Te. The protecting unit 400 comprises a switch control unit 440 and a switch 410. When the switch control unit 440 receives any one of the over-current protection signal Ie and the over-temperature protection signal Te, the switch control unit 440 generates a switch control signal Sc to turn on the switch 410 and so the voltage difference of the source end y and the gate end z is decreased to be zero. At this time, the transistor 32 is turned off to reduce the current flowing through the transistor 32 to zero for example. Therefore, it can make sure that the transistor circuit 30 does not operate out of the safe operating area of the transistor 32. The transistor circuit 30 of the present invention may latch itself to achieve better protecting function when the generated times of the switch control signal Sc reaches a preset latch times.

Figure 5:
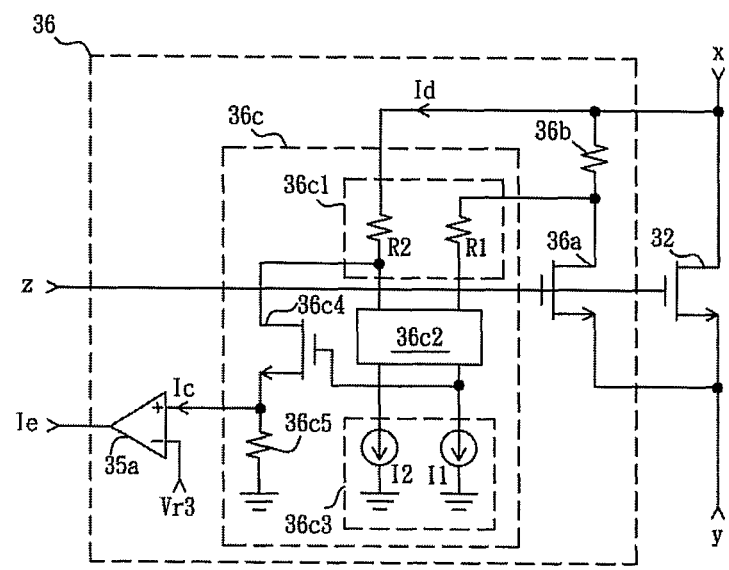
FIG. 5 is a schematic diagram of a current detecting unit according to the present invention.

FIG. 5 is a schematic diagram of a current detecting unit according to the present invention. The current detecting unit comprises a detecting transistor 36a, a current detecting resistance 36b, a current sensing element 36c and a comparator element 35a. The current sensing element 36c comprises an input element 36c1, a current adjust element 36c2, a current source element 36c3, a common gate transistor 36c4 and a reference resistance 36c5. A ratio of a current flowing through the transistor 32 and a current flowing through the detecting transistor 36a is constant. The current detecting resistance 36b is coupled between the drain end x of the transistor 32 and the detecting transistor 36a to generate a current detecting signal Id to the input element 36c1. The input element 36c1 comprises resistances R1, R2 connected in parallel to set a gain of the current sensing element 36c. The current adjust element 36c2 is coupled to the input element 36c1 to adjust the current flowing through the resistances R1, R2 by the current source element 36c3, wherein the current source element 36c3 comprises a first current I1 coupled to the resistance R1 and a second current I2 coupled to the resistance R2. A drain end of the common gate transistor 36c4 is coupled to the connecting node of the resistance R2 and the current adjust element 36c2, a source end thereof is coupled to an end of the reference resistance 36c5, and the other end of the resistance 36c5 is grounded. The gate end of the common gate transistor 36c4 is coupled to the connecting node of the current adjust element 36c2 and the first current I1 to convert the current of the input element 36c1 into a sensing signal Ic in the connecting node of the common gate transistor 36c4 and the reference resistance 36c5. An inverting terminal of the comparator element 35a receives a first reference voltage Vr3 and a non-inverting terminal thereof receives the sensing signal Ic. The comparator element 35a generates an over-current protection signal Ie when a level of the sensing signal Ic is higher than that of the first reference voltage Vr3, i.e., the current flowing through the transistor 32 is higher than a preset current. The transistor circuit 30 may additionally add a current adjust terminal to transmit the sensing signal Ic to other external circuit(s).

Figure 6:
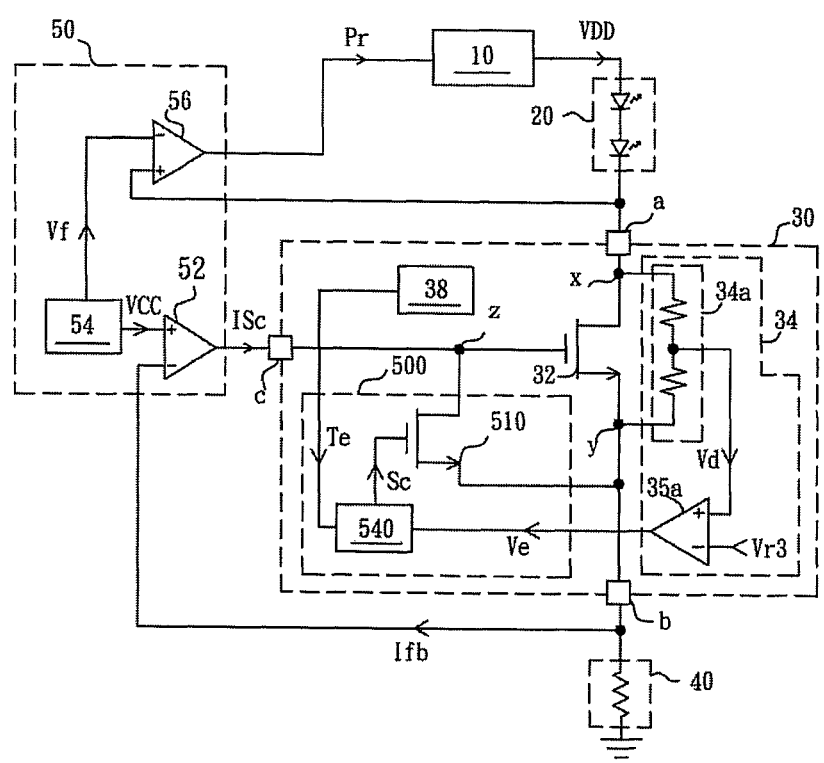
FIG. 6 is a schematic diagram of a transistor circuit with protecting function applied to an LED driving circuit according to a fourth embodiment of the present invention.

FIG. 6 is a schematic diagram of a transistor circuit with protecting function applied to an LED driving circuit according to a fourth embodiment of the present invention. The LED driving circuit comprises a power source supply unit 10, an LED module 20, a transistor circuit 30, a current detecting resistance 40 and an external control unit 50. The power source supply unit 10 is coupled to one terminal of the LED module 20 to supply a driving voltage VDD to drive the LED module 20 lighting. The transistor circuit 30 is packaged in a single package structure and coupled to another terminal of the LED module 20 to control an amount of a current flowing through the LED module 20 according to the a current control signal ISc. The current detecting resistance 40 is coupled to the transistor circuit 30 to detect the amount of the current flowing through the LED module 20 and generate a current feedback signal Ifb. The transistor circuit 30 comprises a transistor 32, a voltage detecting unit 34, a temperature detecting unit 38 and a protecting unit 500. The operation of the transistor circuit 30 is substantially same as the protecting unit 200 shown in FIG. 2. In the present embodiment, the external control unit 50 is used to detect the level of the first terminal a of the transistor circuit 30 to control a power supply of the power source supply unit 10, and so the protection terminal PROT can be omitted in the present embodiment. The external control unit 50 comprises a comparator 52, reference voltage generating element 54 and a power source control element 56. An inverting terminal of the comparator 52 receives the current feedback signal Ifb, and a non-inverting terminal thereof receives a third reference voltage VCC generated by the reference voltage generating element 54 to accordingly generate a current control signal ISc to the control terminal c of the transistor circuit 30. In the present embodiment, the power source control element 56 is a comparator, in which an inverting terminal thereof receives a forth reference voltage Vf generated by the reference voltage generating element 54, and a non-inverting terminal thereof is coupled to the first terminal a of the transistor circuit 30. When the level of the first terminal a of the transistor circuit 30 is higher than that of the forth reference voltage Vf (i.e., the voltage drop of the transistor 32 is too high), the power source control element 56 generates a protection signal Pr to the power source supply unit 10 to stop supplying the power.

Figure 7:
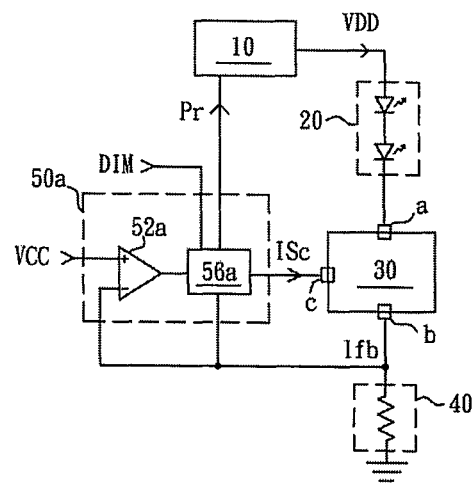
FIG. 7 is a schematic diagram of a transistor circuit with protecting function applied to an LED driving circuit according to the third embodiment of the present invention

FIG. 7 is a schematic diagram of a transistor circuit with protecting function shown in FIG. 4 applied to an LED driving circuit according to the third embodiment of the present invention. The LED driving circuit comprises a power source supply unit 10, an LED module 20, a transistor circuit 30, a current detecting resistance 40 and an external control unit 50a. An over-current protection of the transistor circuit 30 is substantially the same as that shown in FIG. 4. The power source unit 10 is coupled to one terminal of the LED module 20 to supply a driving voltage VDD to drive the LED module 20 lighting. The transistor circuit 30 is packaged in a single package structure and coupled to the other terminal of the LED module 20 to control an amount of a current flowing through LED module 20 according a current control signal ISc. The current detecting resistance 40 is coupled to the transistor circuit 30 to detect the amount of the current flowing through the LED module 20 and generate a current feedback signal Ifb. The external control unit 50a comprises a comparator 52a and a current control element 56a. An inverting terminal of the comparator 52a receives the current feedback signal Ifb, and a non-inverting terminal thereof receives a third reference voltage VCC to generate the current control signal ISc to the power source control element 56a. The power source control element 56a receives the current control signal ISc generated by the comparator 52a and a dimming signal DIM, and accordingly generates the current control signal ISc to control the current flowing through the transistor circuit 30. The dimming signal DIM is switched between a first state and a second state. A stable current flows through the LED module 20 when the dimming signal DIM is at the first state, and no current flows through the LED module 20 when the dimming signal DIM is at the second state. When the LED module 20 occurs the abnormal situation (such as short-circuit) to have an over high current flowing there through. The transistor 30 stops the current flowing there through by the internal protecting circuit. The power source control element 56a receives the current feedback signal Ifb and determines whether the current is zero or not when the dimming signal DIM (responsive that the transistor circuit 30 is operating) is at the first state. If so, it represents that an abnormal situation occurs. At this time, the power source control element 56a outputs a protection signal Pr to stop the power source supply unit 10 supplying the power to the LED module 20 and further avoid the transistor circuit 30 damaged.

Figure 8:
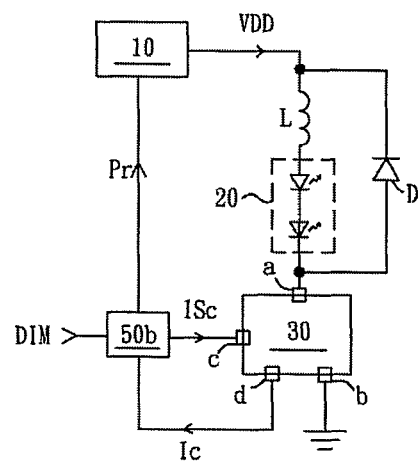
FIG. 8 is a schematic diagram of a transistor circuit with protecting function applied to an LED driving circuit according to a fifth embodiment of the present invention.
Figure 9:
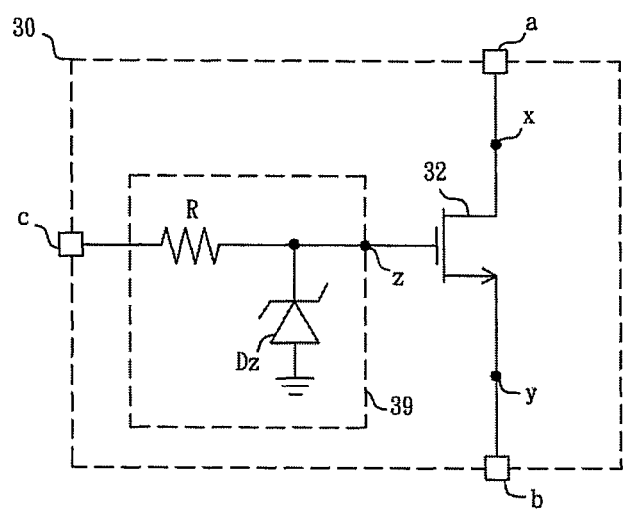
FIG. 9 is a schematic diagram of a transistor circuit with protecting function according to a sixth embodiment of the present invention.

FIG. 8 is a schematic diagram of a transistor circuit with protecting function applied to an LED driving circuit according to a fifth embodiment of the present invention. The LED driving circuit comprises a power source supply unit 10, an LED module 20, a transistor circuit 30 and an external control unit 50b. In the LED driving circuit, an over-current protection of the transistor circuit 30 is substantially the same as the transistor circuit 30 shown in FIG. 4. The power source supply unit 10 is coupled to one terminal of the LED module 20 to supply a driving voltage VDD to drive the LED module 20 lighting. The transistor circuit 30 is coupled to the other terminal of the LED module 20 to control an amount of a current flowing through the LED module 20 according to a current control signal ISc. Compared to the transistor circuit shown in FIG. 4, the transistor circuit 30 in the present embodiment further increase a current detecting pin d to transmit a sensing signal Ic to the external control unit 50a to replace the current detecting resistance 40 shown in FIG. 7 and that can increase the efficiency of the LED driving circuit. The external control unit 50b generates a current control signal ISc in responsive to the sensing signal Ic and a dimming signal DIM. The dimming signal DIM is switched between a first state and a second state. A stable current flows through the LED module 20 when the dimming signal DIM is at the first state, and no current flows through the LED module 20 when the dimming signal DIM is at the second state. In addition, the external control unit 50b can generate a protection signal Pr to the power source supply unit 10 to stop supplying the power when determining that the current flowing through the LED module 20 is higher a preset current protection value. Therefore, the external control unit 50b is capable of protecting the transistor circuit 30 from an over current situation which the transistor circuit 30 can not remove by itself FIG. 9 is a schematic diagram of a transistor circuit with protecting function according to a sixth embodiment of the present invention. The transistor circuit 30 is packaged in a single package structure having a first terminal a, a second terminal b and a control terminal c. The transistor circuit 30 comprises a transistor 32 and a voltage clamping unit 39. The transistor 32 has a drain end x coupled to the first terminal a, a source end y coupled to the second terminal b, and a gate end z coupled to the control terminal c. The voltage clamping unit 39 comprises a resistance R and a zener diode Dz, wherein the resistance R is connected between the gate end of the transistor 32 and the control terminal c, and a cathode terminal of the zener diode Dz is coupled to the gate end z and an anode terminal thereof is grounded. The voltage clamping unit 39 clamps potential level of the gate end z within a preset voltage and so the transistor circuit 30 can avoid being damaged because the voltage difference between the gate end z and the source end y is too high.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A transistor circuit with protecting function, packaged in a single package structure having a first terminal adapted for connection to a load, a second terminal and a control terminal, the transistor circuit comprising:
   a transistor having a drain end, a source end and a gate end, wherein the drain end is coupled to the first terminal, the source end is coupled to the second terminal and the gate end is coupled to the control terminal; wherein the control terminal controls a state of the transistor by a received switch control signal generated by an external control unit;
   a voltage detecting unit, arranged in the same package as the transistor circuit, for detecting a voltage drop between the drain end and the source end of the transistor and generating an over-voltage protection signal; and
   a protecting unit, built in the same package as the transistor circuit, coupled to the control terminal, controlling a state of the transistor according to the over-voltage protection signal;
   wherein the protecting unit reduces a voltage difference between the control terminal and the second terminal when the voltage drop of the transistor is higher than a first preset voltage, such that a current flowing through the transistor is decreased or decreased to zero.

2. The transistor circuit according to claim 1, wherein the voltage detecting unit comprises a voltage dividing element and a comparator element, in which the voltage dividing element generates a voltage detecting signal according to the voltage drop of the transistor, and the comparator element receives the voltage detecting signal and a first reference voltage to accordingly generate the over-voltage protection signal.

3. The transistor circuit according to claim 2, wherein the transistor further has a protection terminal which outputs an output signal when the voltage drop of the transistor is higher than a second preset voltage, and the second preset voltage is higher than or equal to the first preset voltage.

4. The transistor circuit according to claim 1, further comprising a temperature detecting unit to detect a temperature of the transistor circuit to generate an over-temperature protection signal.

5. The transistor circuit according to claim 4, wherein the protecting unit controls the state of the transistor according to the over-temperature protection signal and reduces the voltage difference between the control terminal and the second terminal to make the current flowing through the transistor decreased or decreased to zero while the temperature of the transistor circuit is higher than a preset temperature.

6. The transistor circuit according to claim 1, further comprising a current detecting unit coupled to the first terminal to detect the current flowing through the transistor and generates an over-current protection signal.

7. The transistor circuit according to claim 6, wherein the protecting unit controls the state of the transistor according to the over-current protection signal and reduces the voltage difference between the control terminal and the second terminal to make the current flowing through the transistor decreased or decreased to zero.

8. A transistor circuit with protecting function, packaged in a single package structure having a first terminal adapted for connection to a load, a second terminal and a control terminal, the transistor circuit comprising:
   a transistor having a drain end, a source end and a gate end, wherein the drain end is coupled to the first terminal, the source end is coupled to the second terminal and the gate end is coupled to the control terminal; wherein the control terminal controls a state of the transistor by a received switch control signal generated by an external control unit;
   a current detecting unit, arranged in the same package as the transistor circuit, for detecting a current flowing through the transistor and generating an over-current protection signal; and
   a protecting unit, arranged in the same package as the transistor circuit coupled to the control terminal, controlling a state of the transistor according to the over-current protection signal;
   wherein the protecting unit reduces a voltage difference between the control terminal and the second terminal when the current flowing through the transistor is higher than a preset current, such that the current is decreased or decreased to zero.

9. The transistor circuit according to claim 8, wherein the current detecting unit comprises a detecting transistor, a current detecting resistance and a current detecting unit and to make the current in the transistor flow through the detecting transistor in a preset ratio and the detecting transistor is coupled to the current detecting resistance to generate a current detecting signal to the current detecting unit which generates the over-current protection signal according to the current detecting signal.

10. The transistor circuit according to claim 9, further comprising a protection terminal for outputting an output signal when the current flowing through the transistor is higher than the preset current.

11. The transistor circuit according to claim 8, further comprising a temperature detecting unit to detect a temperature of the transistor circuit and generate an over-temperature protection signal.

12. The transistor circuit according to claim 11, wherein the protecting unit controls the state of the transistor according to the over-temperature protection signal and reduces the voltage difference between the control terminal and the second terminal to make the current flowing through the transistor decreased or decreased to zero when the temperature of the transistor circuit is higher than a preset temperature.

13. The transistor circuit according to claim 8, further comprising a voltage detecting unit coupled between the first terminal and the second terminal to detect a voltage drop between the drain and source ends of the transistor to generate an over-voltage protection signal.

14. The transistor circuit according to claim 13, wherein the protecting unit controls the state of the transistor according to the over-voltage protection signal and reduces the voltage difference between the control terminal and the second terminal to make the current flowing through the transistor decreased or decreased to zero when the voltage drop of the transistor is higher than a preset voltage.

15. The transistor circuit of claim 1, wherein the transistor circuit is a MOSFET.

16. The transistor circuit of claim 8, wherein the transistor circuit is a MOSFET.

* * * * *